United States Patent
Yokoyama et al.

(10) Patent No.: US 8,344,590 B2
(45) Date of Patent: Jan. 1, 2013

(54) ACOUSTIC WAVE DEVICE WITH FREQUENCY CONTROL FILM

(75) Inventors: Tsuyoshi Yokoyama, Tokyo (JP); Shinji Taniguchi, Tokyo (JP); Tokihiro Nishihara, Tokyo (JP); Masanori Ueda, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 13/431,642

(22) Filed: Mar. 27, 2012

(65) Prior Publication Data
US 2012/0200195 A1    Aug. 9, 2012

Related U.S. Application Data

(63) Continuation of application No. PCT/JP2010/064775, filed on Aug. 31, 2010.

(30) Foreign Application Priority Data

Sep. 28, 2009  (JP) ................. 2009-223282

(51) Int. Cl.
*H01L 41/04* (2006.01)
*H03H 9/205* (2006.01)

(52) U.S. Cl. ......... 310/321; 310/320; 333/189; 333/195

(58) Field of Classification Search .......... 310/320, 310/324, 312; 333/187; 257/416, 419–420
See application file for complete search history.

(56) References Cited

U.S. PATENT DOCUMENTS

| | | | |
|---|---|---|---|
| 6,469,597 B2 * | 10/2002 | Ruby et al. | 333/187 |
| 6,657,363 B1 | 12/2003 | Aigner | |
| 6,839,946 B2 * | 1/2005 | Ylilammi et al. | 29/25.35 |
| 7,276,994 B2 * | 10/2007 | Takeuchi et al. | 333/189 |
| 7,358,831 B2 * | 4/2008 | Larson et al. | 333/187 |
| 7,408,428 B2 * | 8/2008 | Larson, III | 333/187 |
| 7,436,269 B2 * | 10/2008 | Wang et al. | 333/133 |
| 7,463,117 B2 * | 12/2008 | Ohara et al. | 333/187 |
| 7,482,737 B2 * | 1/2009 | Yamada et al. | 310/363 |
| 7,602,101 B2 * | 10/2009 | Hara et al. | 310/320 |

(Continued)

FOREIGN PATENT DOCUMENTS

JP    2002-515667 A    5/2002

(Continued)

OTHER PUBLICATIONS

International Search Report (ISR) issued in PCT/JP2010/064775 mailed in Nov. 2010.

(Continued)

*Primary Examiner* — J. San Martin
(74) *Attorney, Agent, or Firm* — Chen Yoshimura LLP

(57) ABSTRACT

An acoustic wave device includes a main resonator and a sub resonator each having a substrate, a lower electrode provided on the substrate, a piezoelectric film provided on the lower electrode, and an upper electrode provided on an upper side of the piezoelectric film. The sub resonator has a mass addition film on the upper electrode in a resonance area in which the upper electrode and the lower electrode face each other. At least one of the main resonator and the sub resonator is provided with a frequency control film on an upper side of the resonance area, and the frequency control film has a weight per unit area smaller than a weight of the mass addition film per unit area.

4 Claims, 12 Drawing Sheets

U.S. PATENT DOCUMENTS

| | | | |
|---|---|---|---|
| 7,649,304 B2 * | 1/2010 | Umeda et al. | 310/320 |
| 7,675,390 B2 * | 3/2010 | Larson, III | 333/189 |
| 7,737,807 B2 * | 6/2010 | Larson et al. | 333/189 |
| 7,791,434 B2 * | 9/2010 | Fazzio et al. | 333/187 |
| 7,868,522 B2 * | 1/2011 | Ruby | 310/346 |
| 8,085,115 B2 * | 12/2011 | Taniguchi et al. | 333/187 |
| 2002/0123177 A1 | 9/2002 | Ruby et al. | |
| 2005/0218754 A1 | 10/2005 | Yokoyama et al. | |
| 2008/0024042 A1 | 1/2008 | Isobe et al. | |
| 2008/0179995 A1 * | 7/2008 | Umeda et al. | 310/324 |
| 2008/0290969 A1 | 11/2008 | Yamakawa et al. | |
| 2009/0001848 A1 | 1/2009 | Umeda et al. | |

FOREIGN PATENT DOCUMENTS

| | | |
|---|---|---|
| JP | 2002-335141 A | 11/2002 |
| JP | 2005-286945 A | 10/2005 |
| JP | 2008-35358 A | 2/2008 |
| WO | 2007/000929 A1 | 1/2007 |
| WO | 2007/119556 A1 | 10/2007 |

OTHER PUBLICATIONS

Written Opinion (PCT/ISA/237) issued in PCT/JP2010/064775 mailed in Nov. 2010. (Concise Explanation of Relevance: This Written Opinion considers the claims are not described by or obvious over the reference Nos. 2-6 cited in ISR above.).

English translation of Written Opinion (PCT/ISA/237) issued in PCT/JP2010/064775 mailed in Nov. 2010. (Japanese Written Opinion and cited references have been submitted in a previous IDS.).

* cited by examiner

US 8,344,590 B2

ACOUSTIC WAVE DEVICE WITH FREQUENCY CONTROL FILM

CROSS-REFERENCE TO RELATED APPLICATIONS

This application is a continuation application of PCT/JP2010/064775 filed on Aug. 31, 2010 claiming the benefit of priority of the prior Japanese Patent Application No. 2009-223282 filed Sep. 28, 2009, the entire contents of which are incorporated herein by reference.

FIELD

A disclosure of the present application relates to an acoustic wave device.

BACKGROUND

Recently, due to the spread of communication devices, which are typified by portable telephones, there have been developed a filter element for radio frequency communications having a feature of passing only electric signals in a particular frequency band by a combination of a plurality of resonators using a surface acoustic wave (SAW) or a bulk acoustic wave (BAW) using a piezoelectric material. Previously, a dielectric filter and a SAW filter were mainly used. Recently, attention has been being drawn to a filter configured to use a piezoelectric thin-film resonator, which is an element having good radio frequency characteristics and capable of downsizing and monolithic forming.

The piezoelectric thin-film resonators have an FBAR (Film Bulk Acoustic Resonator) type and an SMR (Solidly Mounted Resonator) type. The former has an upper electrode/piezoelectric film/lower electrode structure on a substrate as a main structural element, and has a cavity below the lower electrode in an area in which the upper electrode and the lower electrode face each other. Here, the cavity is formed by wet etching of a sacrificed layer provided on the substrate surface on which the lower electrode is disposed, or wet or dry etching of the substrate from its back surface. The latter has a structure using, instead of the above cavity, an acoustic reflection film formed by alternatively stacking a film having a high acoustic impedance and a film having a low acoustic impedance to a thickness of $\lambda/4$ ($\lambda$ is the wavelength of the acoustic wave).

When a radio frequency signal is applied between the upper and lower electrodes of the piezoelectric thin-film resonator as an electric signal, an acoustic wave is excited within the piezoelectric film sandwiched between the upper and lower electrodes due to the inverse piezoelectric effect. Also, a deformation caused by the acoustic wave is converted into an electric signal due to the piezoelectric effect. Since the acoustic wave is totally reflected by an interface between the upper electrode film and air and an interface between the lower electrode film and air, the acoustic wave is a longitudinal vibration wave having main displacements in the thickness direction of the piezoelectric thin-film. By utilizing such a resonance phenomenon, a resonator (or a filter formed by connecting a plurality of resonators together) having a desired frequency characteristic is obtained.

For example, in the piezoelectric thin-film resonator of FBAR type, resonance takes place at frequencies ($H=n\lambda/2$) at which the total film thickness H of the multilayered structure having the main structural element of the upper electrode film/piezoelectric film/lower electrode film formed above the cavity is integer multiples (n times) of ½ of the wavelength $\lambda$ of the acoustic wave. Assuming that V is the propagation velocity of the acoustic wave defined by the material of the piezoelectric film, the resonance frequency F is expressed as $F=nV/(2H)$.

Thus, the resonance frequency F can be controlled by the total thickness H of the multilayered structure.

As a structure of the filter using such a piezoelectric thin-film resonator, there is a ladder type filter in which resonators are connected in series and in parallel in a ladder form. The ladder type filter is widely used because insertion loss and the out-of-band suppression can be easily handled by simply changing the number of stages of the ladder form and the capacitance ratio of the resonators arranged in series and parallel, and the design procedure is simple. There is a lattice type filter having a similar design method.

The filter structure is composed of resonators of a series arm and a parallel arm having different frequencies (the frequency relationship: parallel arm<series arm), and it is required to form the resonators having the different resonance frequencies in a common chip. A resonator connected in a parallel arm (hereinafter, parallel resonator) is designed to have a frequency lower than that of a resonator connected in a series arm (hereinafter; series resonator), and a mass addition film is formed on the upper electrode of the parallel resonator, the frequency being controlled by the mass of the mass addition film.

Patent Document 1 discloses a method of varying the thicknesses of the lower electrode, the piezoelectric film and the upper electrode, which are primary structural films of the resonator, and a method of adjustment by adding a mass addition film in order to realize resonators having resonance frequencies on a common substrate. Patent Document 2 discloses a method of adjustment by patterning a mass addition film on an electrode of a resonator.

PRIOR ART DOCUMENTS

Patent Documents

Patent Document 1: Japanese Patent Application Publication No. 2002-335141
Patent Document 2: U.S. Pat. No. 6,657,363

DISCLOSURE OF THE INVENTION

Problem to Be Solved by the Invention

The acoustic wave device disclosed in Patent Document 1 has a problem that the manufacturing process is complicated and the cost of device is high because the mass addition films having different thicknesses are formed by carrying out a film growing process, a photolithography process and an etching process multiple times.

As the acoustic wave device disclosed in Patent Document 2, in a case where a pattern is formed by using the mass addition film of the parallel resonator, the frequency of the resonator shifts, and the resonance characteristic (resonance Q) deteriorates greatly.

The present invention aims at providing an acoustic wave device having an excellent characteristic by shifting the resonance frequency of at least one of a plurality of piezoelectric thin-film resonators without any characteristic deterioration.

Means for Solving the Problem

A disclosure of the present application is an acoustic wave device comprising a main resonator and a sub resonator each having a substrate, a lower electrode provided on the substrate, a piezoelectric film provided on the lower electrode, and an upper electrode provided on an upper side of the piezoelectric film, the sub resonator having a mass addition film on the upper electrode in a resonance area in which the upper electrode and the lower electrode face each other, at least one of the main resonator and the sub resonator being provided with a frequency control film on an upper side of the resonance area, and the frequency control film having a weight per unit area smaller than a weight of the mass addition film per unit area.

MODES FOR CARRYING OUT THE INVENTION

Embodiments

1. Structure of Acoustic Wave Device

The acoustic wave device disclosed in Japanese Patent Application Publication No. 2002-335141 is configured to newly add the mass addition film on the electrode of the resonator in order to realize resonators having different resonance frequencies. Thus, there is a problem that mass addition films are needed to realize resonators having different resonance frequencies, and that the manufacturing process is complicated and the cost of device is high because the mass addition films having different thicknesses are formed by carrying out a film growing process, a photolithography process and an etching process multiple times.

In the acoustic wave device disclosed in U.S. Pat. No. 6,657,363, the resonance frequency is adjustable by controlling the pitches of the mass addition films formed on the electrodes of the resonators by a patterning step in order to realize resonators having different resonance frequencies in a common chip. By carrying out the growing step, the photolithography step and the etching step once, different patterns of the mass addition films for the multiple resonators can be formed, so that resonators having different resonance frequencies can be formed in the common chip. However, there is a problem that in a case where a pattern is formed by using the mass addition film of the parallel resonator, the frequency of the resonator shifts, and the resonance characteristic (resonance Q) deteriorates greatly. Further, U.S. Pat. No. 6,657,363 has only a disclosure regarding the pitches of the patterns of the mass addition films formed on the electrodes of the resonators, and has no disclosure about other required issues for pattern.

Acoustic wave devices of embodiments aim at providing an acoustic wave device having an excellent characteristic by shifting the resonance frequency of at least one of a plurality of piezoelectric thin-film resonators without any characteristic deterioration.

Embodiment 1

Figure 1A:
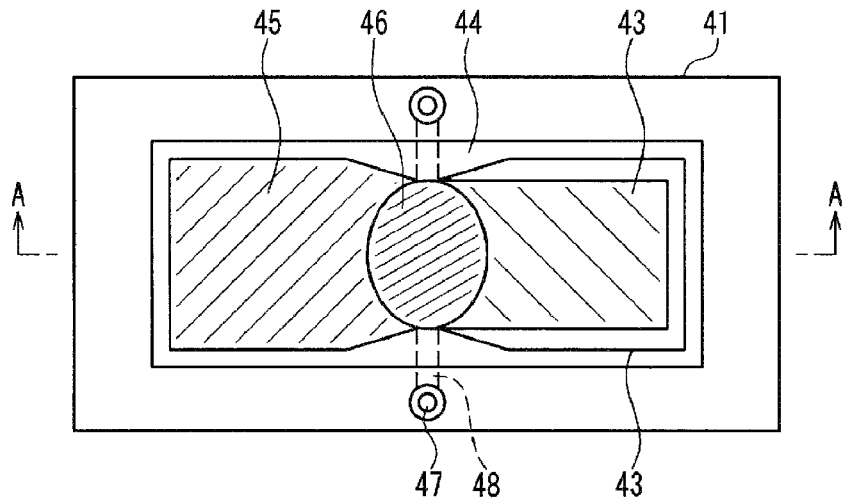
FIG. 1A is a cross-sectional view of a piezoelectric thin-film resonator in accordance with an Embodiment 1.
Figure 1B:
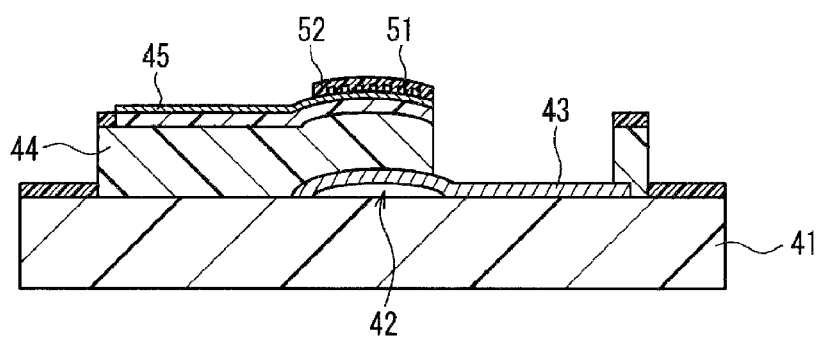
FIG. 1B is a cross-sectional view of a first piezoelectric thin-film resonator.
Figure 1C:
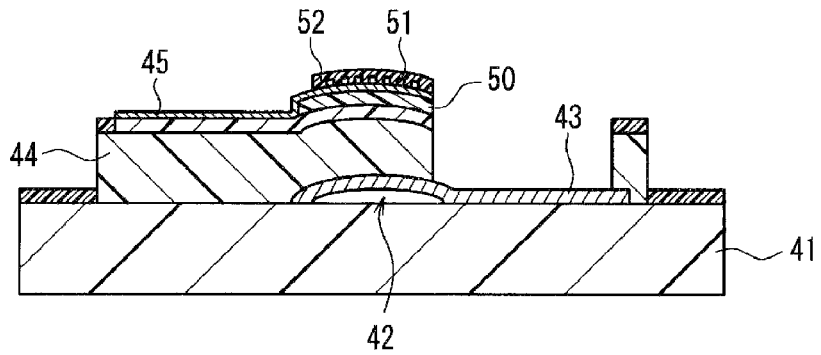
FIG. 1C is a cross-sectional view of a second piezoelectric thin-film resonator.

FIG. 1A~FIG. 1C illustrate an exemplary piezoelectric thin-film resonator, which is an example of the acoustic wave device in accordance with an embodiment. FIG. 1A is a plan view of a piezoelectric thin-film resonator. FIG. 1B is a cross-sectional view taken along a line A-A in FIG. 1A, and is a cross-sectional view of a first piezoelectric thin-film resonator. FIG. 1C is a cross-sectional view of a second piezoelectric thin-film resonator.

Figure 2:
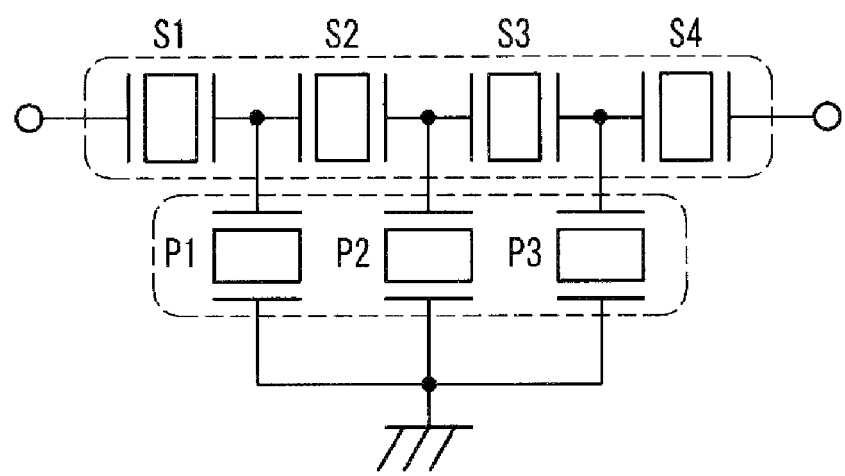
FIG. 2 is a circuit diagram of a ladder type filter.

FIG. 2 indicates a filter circuit in which multiple piezoelectric thin-film resonators of the embodiment are arranged in series arms and parallel arms. Here, resonators connected in series arms are referred to as first piezoelectric thin-film resonators (series resonators) S1~S4, and resonators connected in parallel arms are referred to as second piezoelectric thin-film resonators (parallel resonators) P1~P3.

The piezoelectric thin-film resonator illustrated in FIGS. 1A~1C has a substrate 41, a cavity 42, a lower electrode 43, a piezoelectric film 44, an upper electrode 45, a membrane portion 46, etching medium introduction apertures 47, an etching medium introduction path 48, a sacrificed layer 49, a mass addition film 50, and a frequency control film 51. The substrate 41 uses silicon (Si) in the embodiment. The lower electrode 43 is configured to have a two-layer structure of ruthenium (Ru)/chromium (Cr) in the embodiment. The piezoelectric film 44 uses aluminum nitride (AlN) in the embodiment. The upper electrode 45 is configured to have a two-layer structure of Cr/Ru in the embodiment. The lower electrode 43, the piezoelectric film 44 and the upper electrode 45 may be formed by a film growing method such as sputtering. For example, in a case where the piezoelectric thin-film resonator has a resonance frequency of 2 GHz, the approximate film thickness of each layer is such that Ru of the lower electrode 43 is 250 nm, Cr thereof is 100 nm, AlN of the piezoelectric film 44 is 1150 nm, Cr of the upper electrode 45 is 20 nm, and Ru thereof is 250 nm. The electrode films of the lower electrode 43 and the upper electrode 45 may be made of aluminum (Al), copper (Cu), chromium (Cr), molybdenum (Mo), tungsten (W), tantalum (Ta), platinum (Pt), ruthenium (Ru), rhodium (Rh) or iridium (Ir), or the like. The piezoelectric film 44 may be made of aluminum nitride (AlN), zinc oxide (ZnO), lead zirconate titanate (PZT), lead titanate (Pb-TiO$_3$) or the like. The substrate 41 may be made of silicon (Si), glass, ceramic or the like.

As illustrated in FIG. 1C, the second piezoelectric thin-film resonators P1~P3 has a mass addition film 50. The mass addition film 50 is formed of titanium (Ti) and has a film thickness of 125 nm. The mass addition film 50 is provided between the Cr film of the upper electrode 45 and the Ru film thereof. The mass addition film 50 may be formed to cover at least the membrane portion 46 in which the upper electrode 45 and the lower electrode 43 face each other in order to cause the mass addition film 50 to function as a film that adds a load to the membrane portion 46 in which the upper electrode 45 and the lower electrode 43 face each other. Further, the mass addition film 50 may have an arbitrary shape having a size between a minimum area and a maximum area in which the minimum area is formed to include the upper electrode 45 and the lower electrode 43 face each other, and the maximum area is formed to coincide with the shape of the upper electrode 45.

As illustrated in FIGS. 1B and 1C, a frequency control film 51 is provided on the Cr/Ru upper electrodes of the first piezoelectric thin-film resonators S1~S4 and those of the second piezoelectric thin-film resonators P1~P3. The frequency control film 51 is formed of Ti and has a film thickness of 20 nm in the embodiment. The frequency control film 51 is provided so as to include at least the membrane portion 46 in which the upper electrode 45 and the lower electrode 43 face each other.

A frequency adjustment film 52 is provided on the uppermost layer of the membrane portion 46. The frequency adjustment film 52 is formed of SiO$_2$ in the embodiment. The frequency adjustment film 52 is capable of simultaneously adjusting the resonance frequencies of the first piezoelectric thin-film resonators S1~S4 illustrated in FIG. 1B and those of the second piezoelectric thin-film resonators P1~P3 illustrated in FIG. 1C. That is, the film structure of the first piezoelectric thin-film resonators S1~S4 in the series arms is formed by films in the order of SiO$_2$/Ti/Cr/Ru/AlN/Ru/Cr/Si substrate towards the lowermost layer from the uppermost layer. The film thickness of each layer depends on the required specification of filter, and the films of the lower electrode 43 and the upper electrode 45, the piezoelectric film 44, the mass addition film 50 and the frequency control film 51 may have structures other than those described above. The lower electrode 43 may have a single-layer structure. The mass addition film 50 is sandwiched between the layers of the upper electrode having the two-layer structure, so that the frequency control film 51 may be formed on the same material in both the first piezoelectric thin-film resonators S1~S4 and the second piezoelectric thin-film resonators P1~P3. A dome-shaped cavity 42 (swelling) is formed between the lower surface of the lower electrode 43 and the substrate 41 in the membrane portion 46 in which the upper electrode 45 and the lower electrode 43 face each other. The phrase "dome-shaped cavity" has a relatively small height in the periphery and has an increasing height towards the center.

FIG. 3A~FIG. 3D are cross-sectional views illustrating steps of manufacturing the first piezoelectric thin-film resonators S1~S4. FIG. 4A~FIG. 4D are cross-sectional views illustrating steps of manufacturing the second piezoelectric thin-film resonators P1~P3. FIG. 3A~FIG. 3D and FIG. 4A~FIG. 4D are cross sections taken along a line passing through the center of the membrane portion 46 (A-A in FIG. 1A).

Figure 3A:
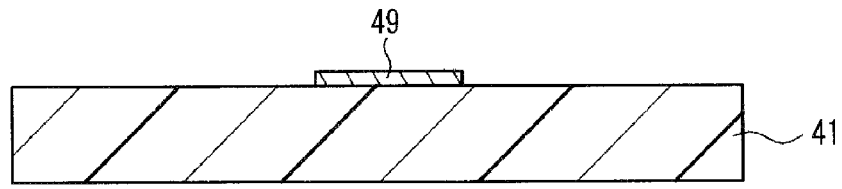
FIG. 3A is a cross-sectional view of a manufacturing step of the first piezoelectric thin-film resonator.
Figure 4A:
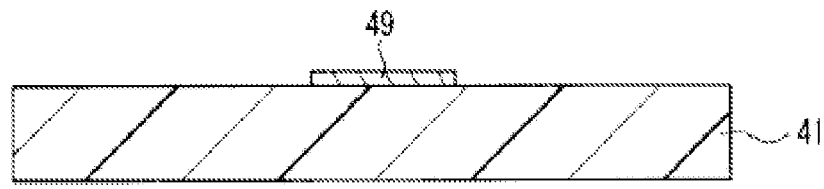
FIG. 4A is a cross-sectional view of a manufacturing process of the second piezoelectric thin-film resonator.

First, as illustrated in FIG. 3A and FIG. 4A, a sacrificed layer 49 made of, for example, magnesium oxide (MgO) or the like is formed on the Si substrate 41 by, for example, a sputtering method or a vapor deposition method. Besides the silicon substrate, the substrate 41 may be a silica substrate, a glass substrate, a ceramic substrate, a GaAs substrate or the like. Specifically, it is preferable to employ a material hard to be etched in order to prevent the substrate 41 from being etched when the sacrificed layer is etched at the step of forming the cavity. It is preferable to form the sacrificed layer 49 of a material easy to be dissolved by an etchant or gas such as ZnO, Ge, Ti, Cu or the like. After the sacrificed layer 49 is formed, the sacrificed layer 49 is formed into a predetermined shape by the exposure technique and the etching technique.

Figure 3B:
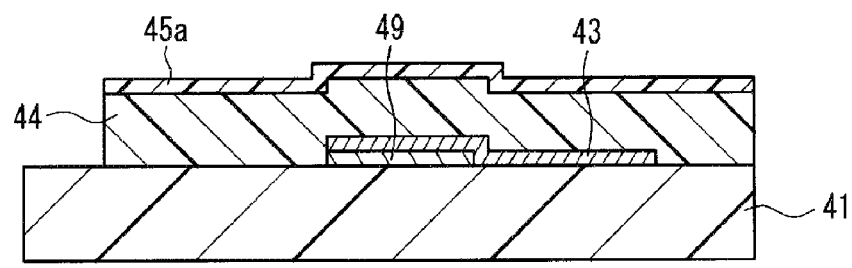
FIG. 3B is a cross-sectional view of a manufacturing step of the first piezoelectric thin-film resonator.
Figure 4B:
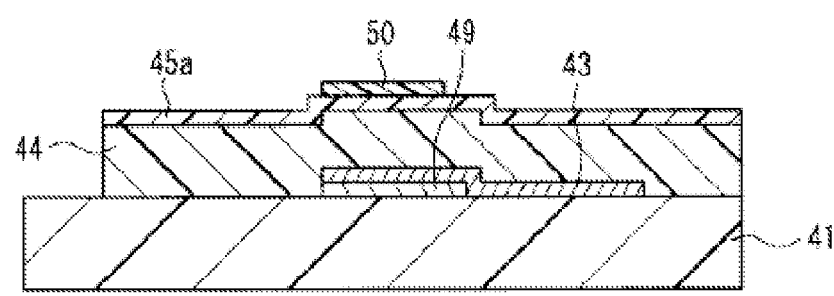
FIG. 4B is a cross-sectional view of a manufacturing process of the second piezoelectric thin-film resonator.

Next, as illustrated in FIG. 3B and FIG. 4B, Ru/Cr is formed by sputtering as the lower electrode 43. Although the two-layer structure of the lower electrode 43 is used, a single-layer structure may be employed. Then, by the exposure technique and the etching technique, the lower electrode 43 is patterned into a desired shape so as to cover the sacrificed layer 49. At this time, the introduction path 48 (see FIG. 1A) for introducing an etching medium for etching the sacrificed layer 49 is formed in the lower electrode 43, and the apertures 47 (see FIG. 1A) for etching the sacrificed layer 49 at the time of forming the cavity may be formed at the ends of the introduction path 48. Subsequently, a film of AlN is grown by sputtering or the like as the piezoelectric film 44. Then, a film of Ru is grown by sputtering or the like as a first layer 45$a$.

Then, as illustrated in FIG. 4B, a film of Ti is formed by sputtering or the like as the mass addition film 50 in the second piezoelectric thin-film resonators. By the exposure technique and the etching technique, the mass addition film 50 is shaped so as to include at least the membrane portion 46 in which the upper electrode 45 and the lower electrode 43 face each other. Patterning of the mass addition film 50 may be implemented by a lift-off method. Growing of the mass addition film 50 is carried out only in the process of manufacturing the second piezoelectric thin-film resonators, and may be omitted in the process of manufacturing the first piezoelectric thin-film resonators.

Figure 3C:
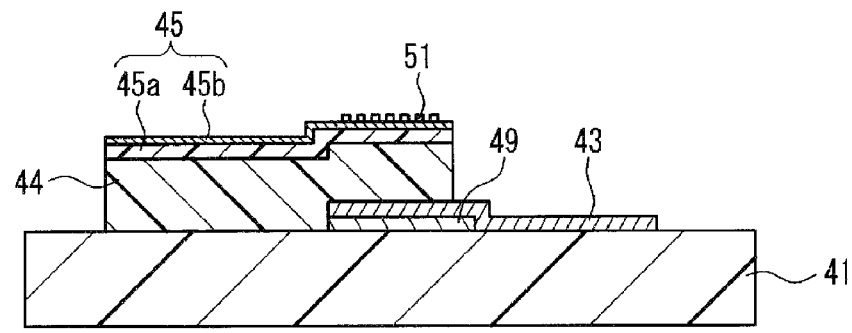
FIG. 3C is a cross-sectional view of a manufacturing step of the first piezoelectric thin-film resonator.
Figure 4C:
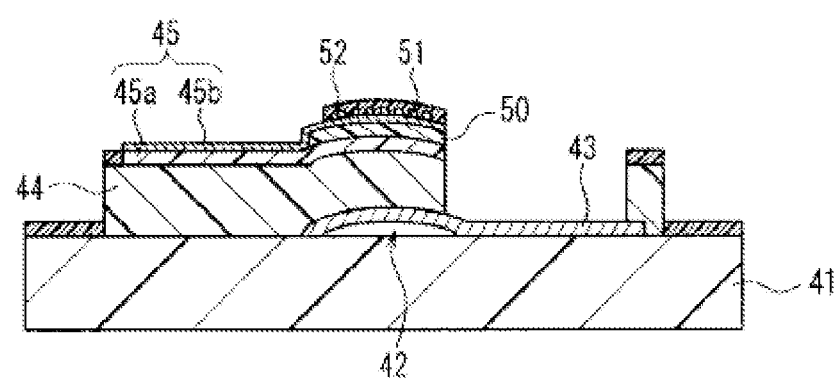
FIG. 4C is a cross-sectional view of a manufacturing process of the second piezoelectric thin-film resonator.

Then, as illustrated in FIG. 3C and FIG. 4C, a film of Cr is grown by sputtering or the like as a second layer 45$b$ of the upper electrode 45. The mass addition film 50 of the second piezoelectric thin-film resonator is sandwiched between the first layer 45$a$ of the upper electrode 45 and the second layer 45$b$ thereof. Then, a film of Ti is grown on the second layer 45$b$ of the upper electrode 45 as the frequency control film 51. Then, by the exposure technique and the etching technique, the frequency control film 51 in an area including at least the membrane portion 46 in which the upper electrode 45 and the lower electrode 43 face each other is patterned into a desired shape. In the present step, by making the patterns on the upper electrodes 45 on the resonators of the filters have different shapes, resonators having different resonance frequencies can be formed by one step.

Here, the frequency control film 51 is configured to have a weight so that the weight per unit area does not affect the acoustic waves excited by the piezoelectric film 44 (AlN), whereby it is possible to suppress the occurrence of unwanted spurious components and deterioration of the resonance characteristic (resonance Q) caused by patterning of the frequency control film 51. "The weight of the frequency control film 51 that does not affect the acoustic waves excited by the piezoelectric film 44" is a weight less than the weight of the mass addition film 50 per unit area, and satisfies a condition of 0.2 g/m² or less per unit area in the embodiment.

Etching of the frequency control film 51 may use either dry etching or wet etching. However, it is preferable to use dry etching because dry etching is capable of easily realizing fine pattern shapes and having a little under etching.

The shape of the frequency control film 51 may have a height lower than the film thickness. However, in order to obtain the resonators having different resonance frequencies, it is required to form patterns having different shapes on the upper electrodes 45 of the resonators by etching. Thus, by forming the shape of the frequency control film 51 so as to have a height corresponding to the film thickness, it is possible to reduce variations in etching for pattern forming and to precisely shift the frequency to a desired frequency.

As the combination of the frequency control film 51 and the upper electrode 45, the use of a combination of materials having a certain etching selectivity makes it possible to precisely shift to the desired frequency without any damage to another film during etching.

Figure 3D:
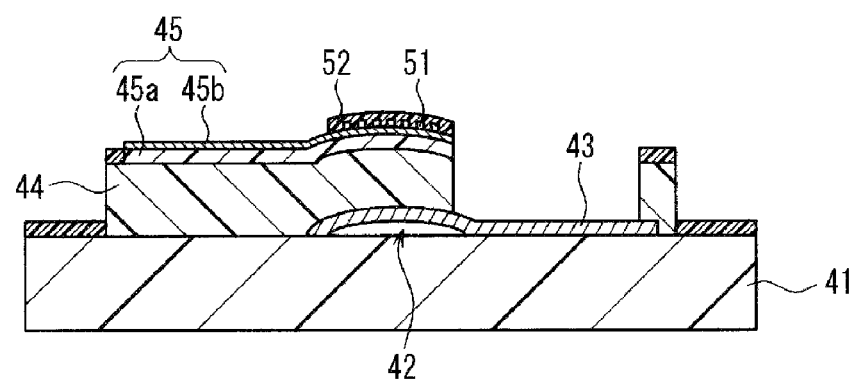
FIG. 3D is a cross-sectional view of a manufacturing process of the first piezoelectric thin-film resonator.
Figure 4D:
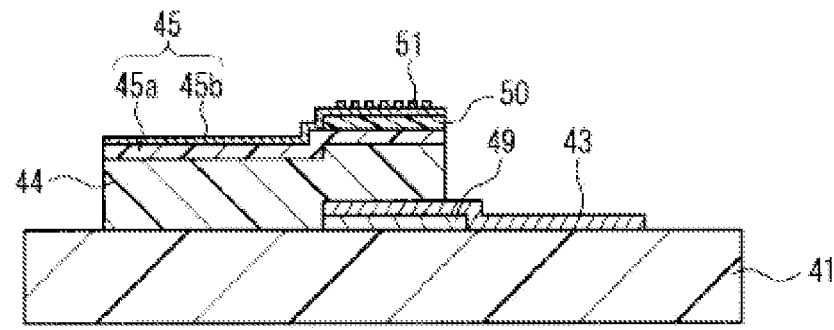
FIG. 4D is a cross-sectional view of a manufacturing process of the second piezoelectric thin-film resonator.

Then, as illustrated in FIG. 3D and FIG. 4D, the upper electrode 45 is patterned into a desired shape by the exposure technique and the etching technique. Then, in order to form a window in the lower electrode 43 and improve the resonance characteristic (resonance Q), the piezoelectric film 44 is patterned into a desired shape by the exposure technique and the etching technique. Then, the frequency adjustment film 52 ($SiO_2$) is grown by sputtering or the like. The material of the frequency adjustment film 52 is not limited to $SiO_2$, but may be another insulative film capable of gradual reduction of part of excitation energy such as a metal oxide film or a metal nitride film.

Then, by the exposure technique and the etching technique, the frequency adjustment film 52 on the upper electrode 45 is removed, and a bump pad (not illustrated) is instead formed.

Finally, by the exposure technique and the etching technique, the frequency adjustment film 52 above the sacrificed layer etching medium introduction apertures 47 (see FIG. 1A) formed in part of the lower electrode 43 is removed. Then, a sacrificed layer etching medium is introduced into the sacrificed layer etching medium introduction apertures 47. The sacrificed layer etching medium passes through the introduction path 48 (see FIG. 1A), and is introduced below the lower electrode 43, whereby the sacrificed layer 49 is removed. Thus, the cavity 42 having a dome-shaped swelling can be formed below the membrane portion 46 in which the upper electrode 45 and the lower electrode 43 face each other. Through the above, the piezoelectric thin-film resonators in accordance with the embodiment are completed.

Etchant for the sacrificed layer 49 is preferably a material hard to etch the materials that form the piezoelectric thin-film resonators other than the sacrificed layer 49, particularly, hard to each the material of the electrode on the sacrificed layer 49 that the etching medium contacts.

The materials of the substrate 41, the lower electrode 43, the upper electrode 45 and the piezoelectric film 44 are not limited to those described above, but other materials may be used. Also, the cavity 42 may be replaced with a structure in which an acoustic reflection film formed by alternatively stacking a film having a high acoustic impedance and a film having a low acoustic impedance to a thickness of λ/4 (λ is the wavelength of the acoustic wave) is disposed between the lower electrode 43 and the substrate 41 in the membrane portion 46.

Figure 5:
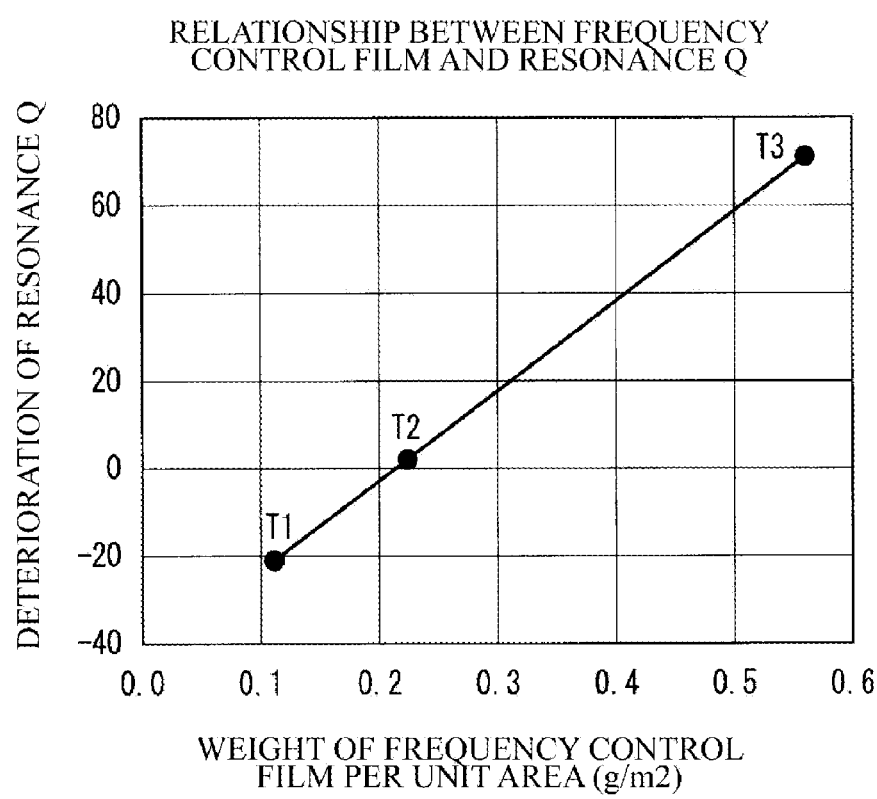
FIG. 5 is a characteristic diagram illustrating a relationship between a frequency control film and a resonance characteristic (resonance Q)

FIG. 5 is a characteristic diagram illustrating a relationship between the weight of the frequency control film 51 per unit area and the resonance characteristic (resonance Q). In FIG. 5, the horizontal axis denotes the weight of the frequency control film 51 per unit area, and the vertical axis denotes deterioration of the resonance characteristic (resonance Q). The vertical axis indicates the value obtained by subtracting the value of the resonance characteristic (resonance Q) of the piezoelectric thin-film resonator 15 in the presence of the frequency control film 51 from the value of the resonance characteristic (resonance Q) of the piezoelectric thin-film resonator in the absence of the frequency control film 51. That is, in the vertical axis, a positive value indicates the amount of deterioration, and a negative value indicates the amount of improvement. Values in FIG. 5 are obtained in a case where the amount of frequency shift is approximately 10 MHz. The thickness of the frequency control film 51 is 25 nm (T1 in FIG. 5), 50 nm (T2 in FIG. 5), and 125 nm (T3 in FIG. 5). The frequency control film 51 is formed in the upper electrode 45 within the resonance area. The frequency control film 51 has patterns that protrude in a convex way (island patterns), and a mass can be applied to the resonance portion by the island patterns. "Weight per unit area" is the product of the material density of the frequency control film 51 and its thickness. As illustrated in FIG. 5, the inventors found out that in a case where the weight of the frequency control film 51 per unit area is equal to or less than 0.2 g/m², the resonance frequency can be shifted without deterioration of the resonance characteristic (resonance Q).

Figure 6A:
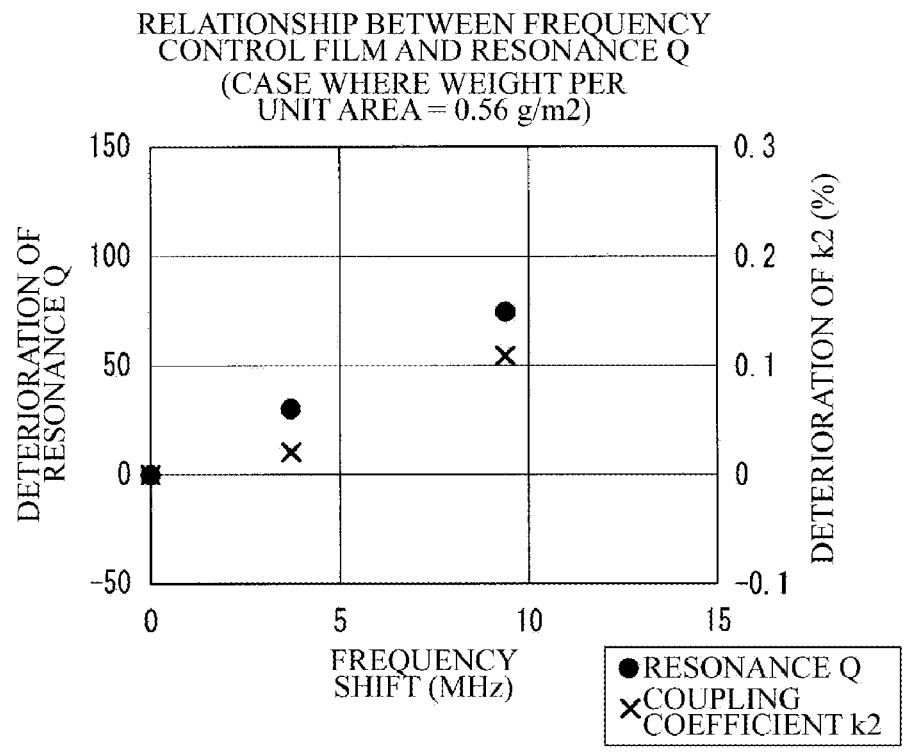
FIG. 6A is a characteristic diagram illustrating a relationship between a frequency shift amount and a resonance characteristic (resonance Q)
Figure 6B:
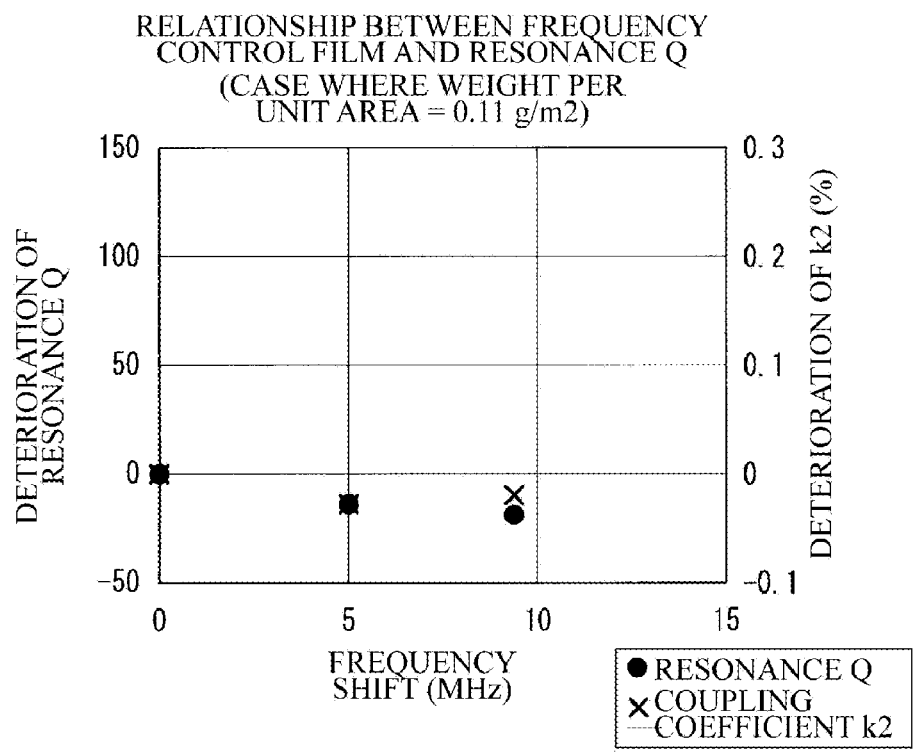
FIG. 6B is a characteristic diagram illustrating a relationship between a frequency shift amount and a resonance characteristic (resonance Q)

FIG. 6A indicates the ratio of deterioration of the resonance characteristic (resonance Q) and that of the coupling coefficient k2 associated with the amount of frequency shift in a case where the weight of the frequency control film per unit area is 0.56 g/m². FIG. 6B indicates the ratio of deterioration of the resonance characteristic (resonance Q) and that of the coupling coefficient k2 associated with the amount of frequency shift in a case where the weight of the frequency control film per unit area is 0.11 g/m². In the case of FIG. 6A, both the resonance characteristic (resonance Q) and the coupling coefficient k2 deteriorate as the amount of frequency shift increases, whereas in the case of FIG. 6B, deterioration of the resonance characteristic (resonance Q) and that of the coupling coefficient k2 were not observed.

A mechanism of the piezoelectric thin-film resonator in accordance with the present is described.

Generally, when a voltage is applied between the upper electrode and the lower electrode of the piezoelectric thin-film resonator, an electric field is developed in the membrane portion 46 in which the upper electrode and the lower electrode face each other in its thickness direction, and the piezoelectric film expands and contracts. In other words, the acoustic waves are propagated in the thickness direction of the resonance area of the piezoelectric film. Since the upper portion of the upper electrode and the lower portion of the lower electrode are boundaries with vacuum (or gas), free edge reflection of the acoustic waves takes place. During repetitive reflection of the acoustic waves, frequency components that are not in phase with the total film thickness in the portion where the acoustic waves are developed cancel each other. Finally, only the acoustic waves in which integer multiples of the halves of the wavelengths of the acoustic waves coincide with the total film thickness can exist, and a resonance phenomenon is caused.

In the presence of the frequency control film in which patterns are formed, there is a difference in the total thickness between a portion with patterns and another portion without patterns. Thus, the resonance phenomenon takes place in two portions that are a portion with patterns and another portion without patterns. In a case where a filter is manufactured by using a resonator with two resonance characteristics (resonance Q), since one of the two resonance characteristics (resonance Q) functions as a spurious component, it is necessary to limit to only one resonance characteristic (resonance Q). Further, since two resonance characteristics (resonance q) take place, the resonance characteristic (resonance Q) itself deteriorates. Conventionally, it was considered that the acoustic waves do not recognize the patterns when a pattern pitch of the frequency control film is made smaller than the wavelength of the acoustic waves excited in the piezoelectric film. However, the present inventors found out that the pattern pitch does not have an influence on the characteristics but the weight of the portion with a pattern per unit area does. The inventors found out that in a case where the weight of the portion with a pattern per unit area is sufficiently small, even when a film having a pattern is formed on the upper electrode, the acoustic waves excited in the piezoelectric film do not recognize a portion with a pattern and another portion without any pattern. The weight per unit area is represented as the product of the density of the material of the frequency control film and the thickness thereof.

Figure 7:
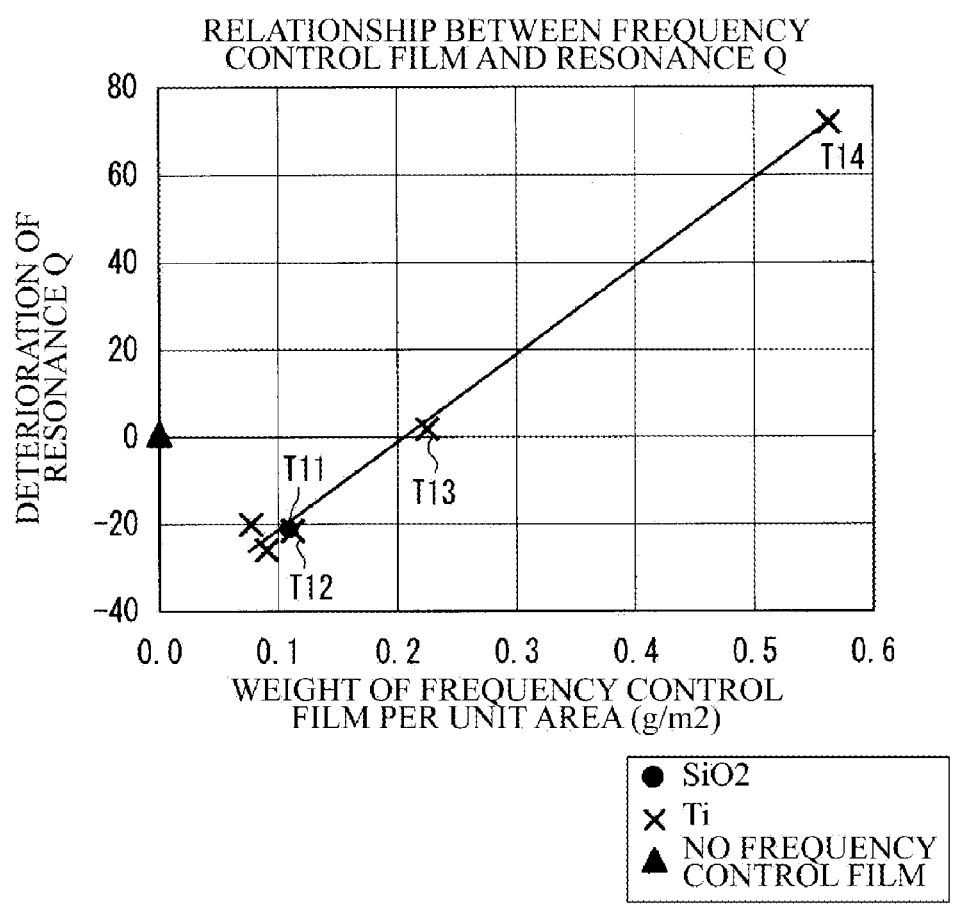
FIG. 7 is a characteristic diagram illustrating a relationship between a frequency control film and a resonance characteristic (resonance Q)

FIG. 7 is a characteristic diagram of a case where Ti or $SiO_2$ is used for the frequency control film 51 in which the horizontal axis denotes deterioration of the resonance characteristic (resonance Q) and the horizontal axis denotes the weight per unit area. The thickness of the frequency control film 51 made of $SiO_2$ is set to 50 nm (T11 in FIG. 7). Further, values in cases where the frequency control film 51 is made of Ti and is 25 nm thick (T12), 50 nm thick (T13) and 125 nm thick (T14) are plotted.

As illustrated in FIG. 7, the resonance characteristic (resonance Q) of the case where $SiO_2$ is formed to have a film thickness of 50 nm (T11) substantially coincides with the resonance characteristic (resonance Q) of the case where Ti is formed to have a thickness of 25 nm (T12). That is, it can be seen that even when there is a difference in material or thickness between the frequency control films 51, by making the weights of these films per unit area equal to each other, deterioration of the characteristics caused by the frequency shift can be suppressed. This shows that the thickness of the frequency control film 51 is not important but the resonance frequency of the resonator can be shifted without any deterioration of the resonance characteristic (resonance Q) by selecting the product of the density and thickness of the frequency control film 51 so that the weight per unit area is equal to a weight that does not affect the acoustic waves excited by the piezoelectric film 44.

Although the patterns of the frequency control film 51 are island patterns (convex form) in the embodiment, the patterns may be hole patterns (concave form) if the hole patterns realize an arbitrary weight per unit area.

Figure 8:
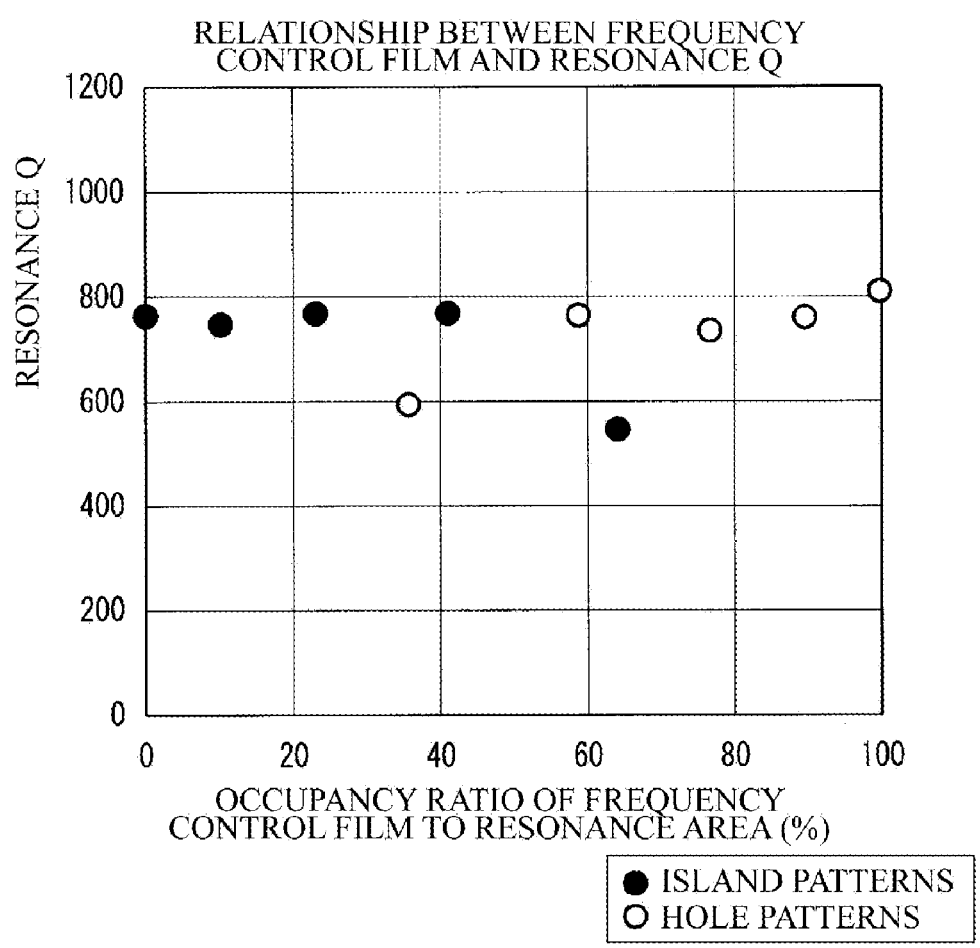
FIG. 8 is a characteristic diagram illustrating a relationship between an occupancy ratio of a frequency control film and a resonance characteristic (resonance Q)

FIG. 8 is a graph showing a relationship between the occupancy ratio of the frequency control film 51 and the resonance characteristic (resonance Q). As illustrated in FIG. 8, in a case where the frequency control film 51 with the island patterns, the occupancy ratio of the frequency control film 51 to the membrane portion 46 is equal to or lower than 40%. Also, in a case where the frequency control film 51 with the hole patterns, the occupancy ratio of the frequency control film 51 to the membrane portion 46 is preferably equal to or higher than 60%. The island patterns having an occupancy ratio of not greater than 40% and the hold patterns having an occupancy ratio of not less than 60% have an approximately equal weight for unit area.

Also, the patterns of the frequency control film 51 may have circular e or elliptical shapes. The patterns of the frequency control film 51 may have a shape including a curve. By forming the frequency control film into any of the above-described shapes, it is easy to precisely form the desired patterns at the time of forming the patterns, and it is possible to minutely shift the resonance frequency of the resonator to the desired frequency.

Embodiment 2

Figure 9:
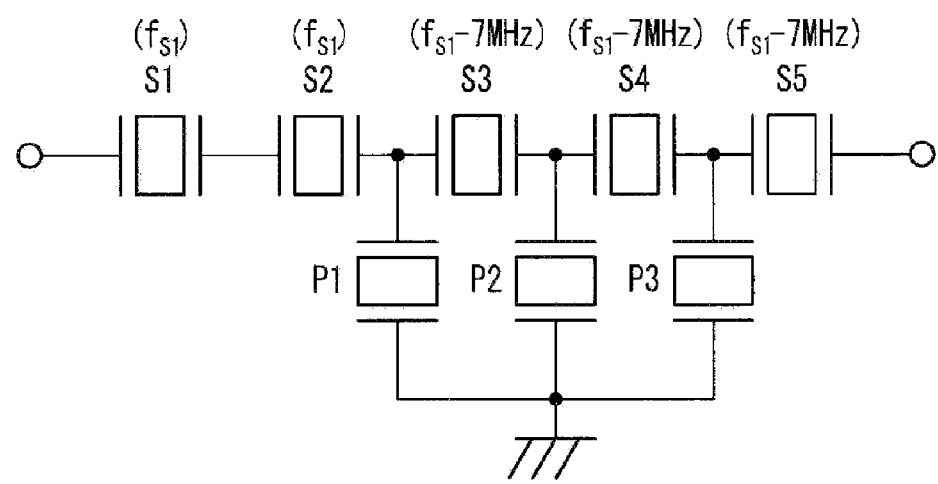
FIG. 9 is a circuit diagram of a ladder type filter in accordance with an Embodiment 2.

Next, a description is given, as Embodiment 2, of a ladder type filter configured to connect piezoelectric thin-film resonators in a ladder form of the above-described embodiment FIG. 9 is a circuit diagram of a ladder type filter in accordance with the embodiment. The ladder type filter is equipped with first piezoelectric thin-film resonators S1~S5 connected in series arms, and second piezoelectric thin-film resonators P1~P3 connected in parallel arms. Assuming that the resonance frequency S1 is denoted as $F_{S1}$, each of the resonators S1~S5 has the frequency control film 51 so that the resonance frequency of the second resonator S2 is $f_{S1}$, and the resonance frequencies of the resonators S3, S4 and S5 are $f_{S1}$−7 MHz.

Figure 10:
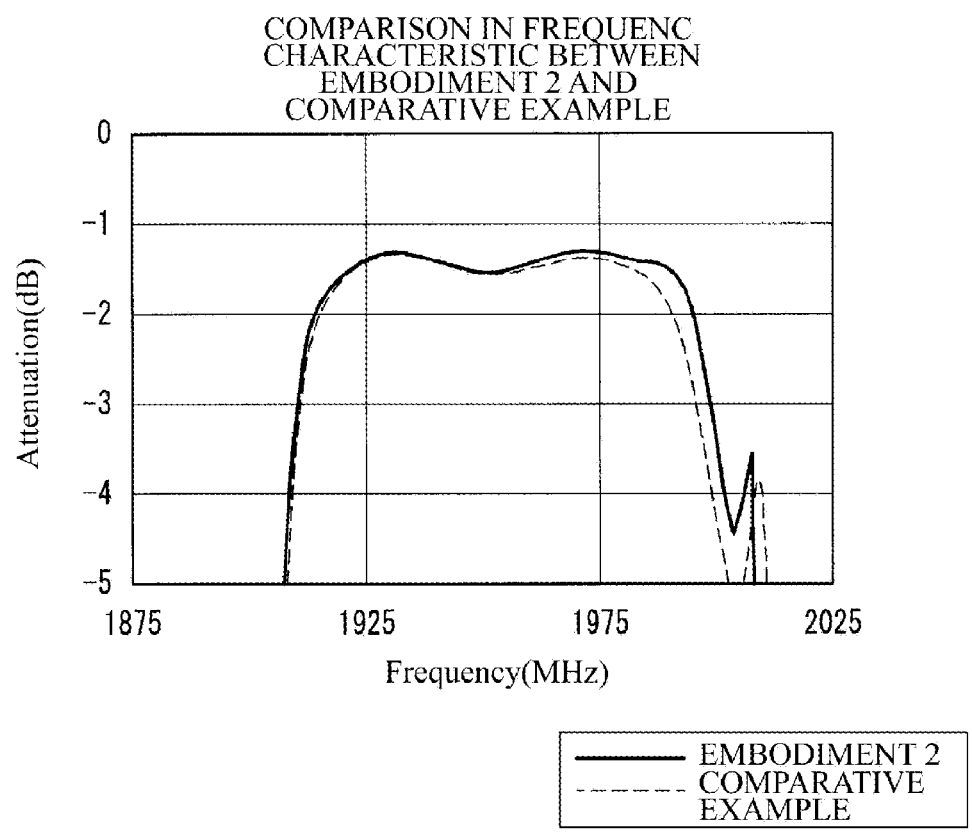
FIG. 10 is a characteristic diagram of frequency characteristics of the Embodiment 2 and a comparative example.

FIG. 10 illustrates pass characteristics of ladder type filters respectively configured so that the weight of the frequency control film 51 per unit area is 0.56 g/m$^2$ (comparative example) and is 0.11 g/m$^2$ (Embodiment 2). In the case where the weight of the frequency control film 51 per unit area is 0.56 g/m$^2$, the resonance characteristic (resonance Q) of each piezoelectric thin-film resonator included in the ladder type filter deteriorates when the resonance frequencies of the resonators are shifted. In contrast, in the case where the weight of the frequency control film 51 of Embodiment 2 is 0.11 g/m$^2$, the resonance frequencies of the piezoelectric thin-film resonators included in the ladder type filter can be shifted without any deterioration of the resonance characteristics (resonance Q) of the resonators.

2. Structure of Communication Module

Figure 11:
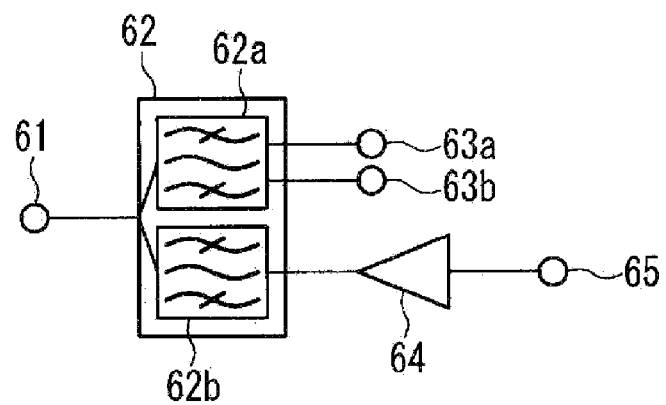
FIG. 11 is a block diagram of a communication module.

FIG. 11 illustrates an exemplary communication module having the piezoelectric thin-film resonators of the embodiment. As illustrated in FIG. 11, a duplexer 62 is equipped with a reception filter 62a and a transmission filter 62b. To the reception filter 62a, connected are, for example, reception terminals 63a and 63b for balance output. The transmission filter 62b is coupled to a transmission terminal 65 via a power amplifier 64. The reception filter 62a has the piezoelectric thin-film resonators of the embodiment.

In reception operation, the reception filter 62a passes only signals in a given frequency band out of reception signals input via an antenna terminal 61, and outputs the signals to the outside via the reception terminals 63a and 63b. In transmission operation, the transmission filter 62b passes only signals in a given frequency band out of transmission signals applied via a transmission terminal 65 and amplified by a power amplifier 64, and outputs the signals to the outside via the antenna terminal 61.

Since the piezoelectric thin-film resonators of the embodiment are used in the communication module, the communication module has excellent pass characteristics. It is also possible to reduce the manufacturing process for the communication module.

The communication module illustrated in FIG. 11 is just an example, and other types of communication modules in which the filters of the embodiment are installed have similar effects.

3. Structure of Communication Device

Figure 12:
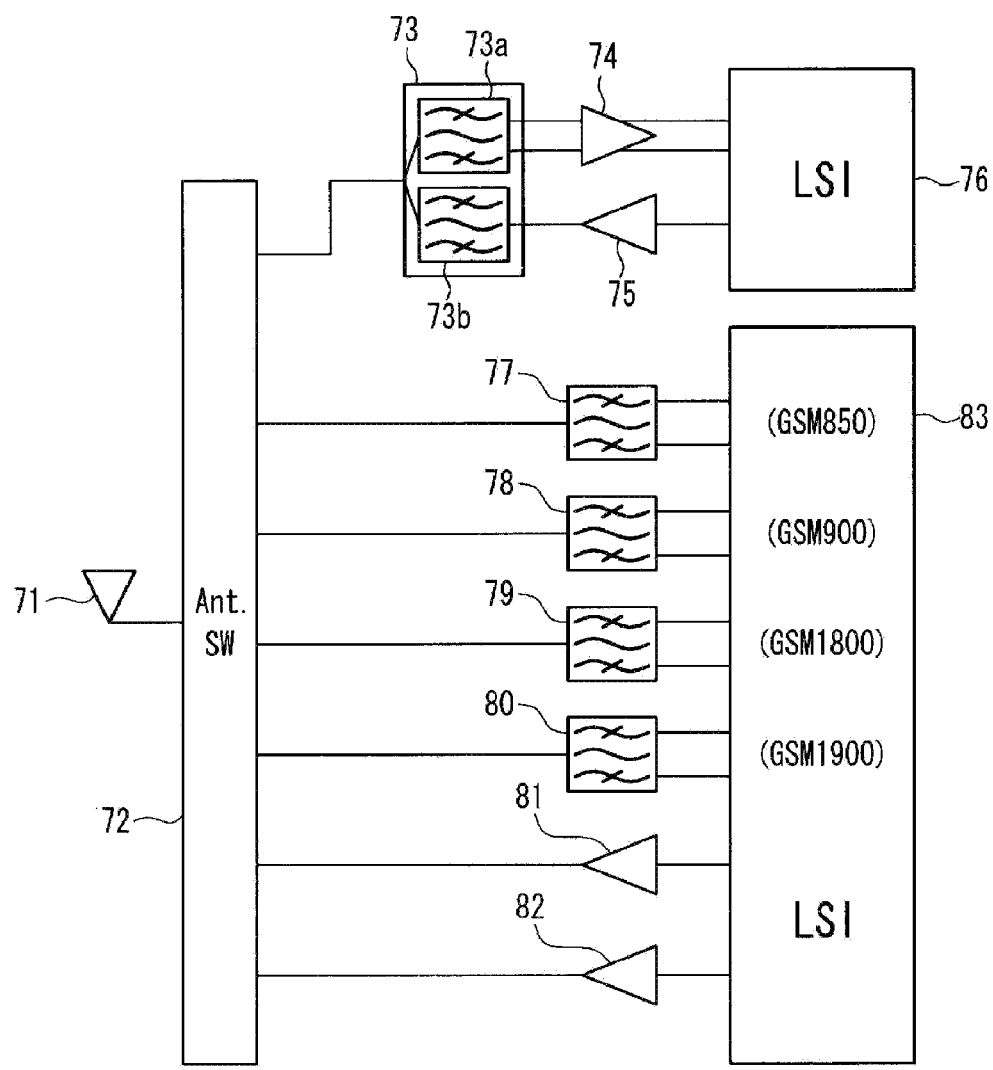
FIG. 12 is a block diagram of communication device.

FIG. 12 illustrates an R1 block of a portable telephone terminal as an exemplary communication device equipped with the piezoelectric thin-film resonators of the embodiment or the above-mentioned communication module. The communication device illustrated in FIG. 12 has a structure of a portable telephone terminal that conform to a GSM (Global System for Mobile Communications) system and a W-CDMA (Wideband Code Division Multiple Access) system. The GSM system of the embodiment handles the 850 MHz band, 950 MHz band, 1.8 GHz band and 1.9 GHz band. Although the portable telephone terminal is equipped with a microphone, a speaker, a liquid crystal display and so on besides the structure illustrated in FIG. 12, these structures are not involved in the description of the present invention and a description thereof is omitted. Reception filters 73a and 77~80 have the piezoelectric thin-film resonators of the embodiment.

In association with a reception signal input via an antenna 71, an LSI to be operated is selected by an antenna switch circuit 72 on the basis of whether the communication system of the reception signal is W-CDMA or GSM. When the input reception signal conforms to the W-CDMA system, switching is made to output the reception signal to a duplexer 73. The reception signal input to the duplexer 73 is limited to the given frequency band by a reception filter 73a, and balanced reception signals are output to LNA 74. The LNA 74 amplifies the input reception signal, and outputs the amplified signal to LSI 76. The LSI 76 executes a demodulation process to reproduce the speech signal based on the input reception signal and controls the operations of parts of the portable telephone terminal.

In signal transmission, the LSI 76 generates a transmission signal. The transmission signal generated is amplified by a power amplifier 75 and is input to a transmission filter 73b. The transmission filter 73b passes only signals in a given frequency band out of the input transmission signals. The transmission signal output from the transmission filter 73b is output to the outside from the antenna 71 via the antenna switch circuit 72.

When the input reception signal is a signal that conforms to the GSM system, the antenna switch circuit 72 selects one of reception filters 77~80 in accordance with the frequency band of the reception signal, and outputs it to the selected reception filter. The reception signal having a limited band by any one of the reception filters 77~80 is input to an LSI 83. The LSI 83 executes a demodulation process to reproduce the speech signal based on the input reception signal and controls the operations of parts of the portable telephone terminal. When a signal is to be transmitted, the LSI 83 generates a transmission signal. The transmission signal generated is amplified by a power amplifier 81 or 82, and is output to the outside from the antenna 71 via the antenna switch circuit 72.

It is possible to realize a communication device having an excellent pass characteristic by installing the piezoelectric thin-film resonators or the communication module in accordance with the embodiment. Further, it is possible to reduce the manufacturing process for the communication device The communication device illustrated in FIG. 12 is just an example, and other types of communication devices in which the piezoelectric thin-film resonators of the embodiment are installed have similar effects.

4. Effects of Embodiments, Others

According to the embodiments, since the cavity 42 is formed into a dome shape protruding towards the composite films, there is no need to etch the substrate 41, so that the productivity can be improved. Further, since the substrate 41 is not etched, it is possible to prevent deterioration of the mechanical strength of the substrate 41. Furthermore, it is fine to define a small area in which the cavity 42 is formed, integration can be facilitated.

Further, by forming the membrane portion 46 in which the upper electrode 45 and the lower electrode 43 face each other into an ellipse or a polygon formed by non-parallel sides, the membrane portion 46 does not have sides parallel to each other, so that the acoustic waves reflected by the outer edges of the electrodes can be prevented from existing in the resonance portion as horizontal standing waves. It is thus possible to suppress the occurrence of ripples in the pass band.

Further, an area of the cavity projected onto the substrate surface includes the area in which the upper electrode and the lower electrode face each other, so that the resonance characteristic (resonance Q) of the piezoelectric thin-film resonator can be improved and excellent performance can be realized.

Instead of the above-described manufacturing process, anther manufacturing process may be used to manufacture the piezoelectric thin-film resonators of Embodiment 1 or the filter of Embodiment 2. For example, after the bump pad forming step is completed without forming the sacrificed layer 49, on the back surface of the substrate 41, formed is a resist pattern having an opening so as to include the membrane portion 46 in which the upper electrode 45 and the lower electrode 43 face each other. Next, from the back surface of the substrate 41, dry etching is carried out to make the side wall approximately vertical to the substrate surface under the condition that etching with $SF_6$ and forming of a side wall protection film with $C_4F_8$ are alternately executed repetitively, so that the cavity 42 can be formed below the membrane portion 46 in which the upper electrode 45 and the lower electrode 43 face each other. It is thus possible to manufacture the piezoelectric thin-film resonator, and a filter configured to connect multiple piezoelectric thin-film resonators together.

Although the ladder type filter is described as an example in the embodiments, the filter may be a lattice type of filter configured to connect multiple resonators in a lattice form.

The first piezoelectric thin-film resonator (series resonator) in the embodiments is an example of the main resonator of the invention. The second piezoelectric thin-film resonator (parallel resonator) in the embodiments is a sub resonator of the invention. The substrate 41 in the embodiments is an example of the substrate of the invention. The lower electrode 43 in the embodiments is an example of the lower electrode of the invention. The upper electrode 45 in the embodiments is an example of the upper electrode of the invention. The piezoelectric film 44 in the embodiments is an example of the piezoelectric film of the invention. The mass addition film 50 in the embodiments is an example of the mass addition film of the invention. The frequency control film 51 in the embodiments is an embodiment of the frequency control film of the invention. The membrane portion 46 in the embodiments is an example of a resonance area of the invention. The cavity 42 in the embodiments is an example of a cavity of the invention.

Regarding the embodiments, the following Items are additionally disclosed.

(Item 1)

An acoustic wave device comprising a main resonator and a sub resonator each having a substrate, a lower electrode provided on the substrate, a piezoelectric film provided on the lower electrode, and an upper electrode provided on an upper side of the piezoelectric film, the sub resonator having a mass addition film on the upper electrode in a resonance area in which the upper electrode and the lower electrode face each other, at least one of the main resonator and the sub resonator being provided with a frequency control film on an upper side of the resonance area, and the frequency control film having a weight per unit area smaller than a weight of the mass addition film per unit area.

(Item 2)

The acoustic wave device according to Item 1, wherein the weight of the frequency control film is equal to or smaller than 0.2 g/m².

(Item 3)

The acoustic wave device according to Item 1 or Item 2, wherein a shape of the frequency control film is an island pattern having a convex shape.

(Item 4)

The acoustic wave device according to Item 1 or Item 2, wherein a shape of the frequency control film is a hole pattern having a concave shape.

(Item 5)

The acoustic wave device according to Item 1 or Item 2, wherein the acoustic wave device has a resonator having a frequency control film having an island pattern of a convex shape, and a resonator having a frequency control film having a hole pattern of a concave shape.

(Item 6)

The acoustic wave device according to Item 1 or Item 2, wherein a shape of the frequency control film has a height corresponding to a thickness of the frequency control film.

(Item 7)

The acoustic wave device according to any one of Item 1~Item 6, wherein patterns formed by the frequency control film are formed in a dispersed form in the resonance area.

(Item 8)

The acoustic wave device according to any one of Item 1~Item 7, wherein patterns formed by the frequency control film have a circle or ellipse.

(Item 9)

The acoustic wave device according to any one of Item 1~Item 8, wherein patterns formed by the frequency adjustment film have a shape including a curve.

(Item 10)

The acoustic wave device according to any one of Item 1~Item 9, wherein the frequency control film and the upper electrode have different materials.

(Item 11)

The acoustic wave device according to any one of Item 1~Item 10, wherein the frequency control film and the upper electrode have a combination of materials having an etching selectivity.

(Item 12)

The acoustic wave device according to any one of Item 1~Item 11, wherein the resonance area has an elliptical shape.

(Item 13)

The acoustic wave device according to any one of Item 1~Item 11, wherein the resonance area has a polygon composed of lines not parallel to each other.

(Item 14)

The acoustic wave device according to any one of Item 1~Item 13, wherein there is formed a cavity having a dome-shaped swelling between a lower portion of the lower electrode that overlaps at least the resonance area and the substrate, a contour of the cavity has a closed shape formed by a curve.

(Item 15)

The acoustic wave device according to any one of Item 1~Item 14, wherein an area formed by projecting the resonance area onto the substrate is included in an area formed by projecting the cavity onto the substrate.

(Item 16)

The acoustic wave device according to any one of Item 1~Item 13, wherein the substrate has a cavity in an area that overlaps the resonance area.

(Item 17)

The acoustic wave device, wherein the main resonator and the sub resonator are connected in a ladder type or a lattice type.

(Item 18)

A filter having the acoustic wave device as described in any one of Item 1~Item 17.

(Item 19)

A duplexer having the acoustic wave device as described in any one of Item 1~Item 17.

(Item 20)

A communication module having the acoustic wave device as described in any one of Item 1~Item 17, the filter described in Item 18, or the duplexer as described in Item 19.

(Item 21)

A communication device having the acoustic wave device as described in any one of Item 1~Item 17, the filter described in Item 18, the duplexer as described in Item 19, or the communication module as described in Item 20.

INDUSTRIAL APPLICABILITY

The present application is useful to the acoustic wave devices, filters, communication modules and communication devices.

DESCRIPTION OF REFERENCE NUMERALS 41 substrate
42 cavity
43 lower electrode
44 piezoelectric film
45 upper electrode
46 membrane portion
47 etching medium introduction aperture
48 sacrificed layer etching medium introduction path
49 sacrificed layer
50 mass addition film
51 frequency control film
52 frequency adjustment film

What is claimed is:

1. An acoustic wave device comprising a main resonator and a sub resonator each having a substrate, a lower electrode provided on the substrate, a piezoelectric film provided on the lower electrode, and an upper electrode provided on an upper side of the piezoelectric film, the sub resonator having a mass addition film on the upper electrode in a resonance area in which the upper electrode and the lower electrode face each other, at least one of the main resonator and the sub resonator being provided with a frequency control film on an upper side of the resonance area, and the frequency control film having a weight per unit area smaller than a weight of the mass addition film per unit area and having patterns of a convex or concave shape, and the patterns being formed in a dispersed form in the resonance area, wherein:
the main resonator does not have the mass addition film; and
the main resonator is a series resonator of a ladder type filter and the sub resonator is a parallel resonator of the ladder type filter.

2. The acoustic wave device according to claim 1, wherein the weight of the frequency control film is equal to or smaller than 0.2 g/m².

3. The acoustic wave device according to claim 2, wherein the frequency adjustment film has a circular or elliptical shape.

4. The acoustic wave device according to claim 1, wherein the frequency adjustment film has a circular or elliptical shape.

* * * * *